(12) United States Patent
Kawaue et al.

(10) Patent No.: US 9,914,847 B2
(45) Date of Patent: Mar. 13, 2018

(54) RESIN COMPOSITION FOR FORMING A PHASE-SEPARATED STRUCTURE, AND METHOD OF PRODUCING STRUCTURE CONTAINING PHASE-SEPARATED STRUCTURE

(71) Applicants: TOKYO OHKA KOGYO CO., LTD., Kawasaki-shi (JP); The University of Chicago, Chicago, IL (US)

(72) Inventors: Akiya Kawaue, Kawasaki (JP); Takehiro Seshimo, Kawasaki (JP); Takaya Maehashi, Kawasaki (JP); Tasuku Matsumiya, Kawasaki (JP); Ken Miyagi, Kawasaki (JP); Hitoshi Yamano, Kawasaki (JP); Xuanxuan Chen, Heverlee (BE); Paul Franklin Nealey, Chicago, IL (US)

(73) Assignees: TOKYO OHKA KOGYO CO., LTD., Kawasaki-Shi (JP); THE UNIVERSITY OF CHICAGO, Chicago, IL (US)

( * ) Notice: Subject to any disclaimer, the term of this patent is extended or adjusted under 35 U.S.C. 154(b) by 0 days.

(21) Appl. No.: 15/185,899

(22) Filed: Jun. 17, 2016

(65) Prior Publication Data
US 2017/0362460 A1  Dec. 21, 2017

(51) Int. Cl.
| | | |
|---|---|---|
| *B01J 41/00* | (2006.01) |
| *C09D 153/00* | (2006.01) |
| *C09D 5/00* | (2006.01) |
| *C09D 7/12* | (2006.01) |
| *B05D 1/00* | (2006.01) |
| *B05D 3/10* | (2006.01) |

(52) U.S. Cl.
CPC .......... *C09D 153/00* (2013.01); *B05D 1/005* (2013.01); *B05D 3/107* (2013.01); *C09D 5/00* (2013.01); *C09D 7/1233* (2013.01)

(58) Field of Classification Search
CPC ....... C09D 5/00; C09D 7/1233; C09D 153/00
See application file for complete search history.

(56) References Cited

U.S. PATENT DOCUMENTS

2014/0088207 A1* 3/2014 Elabd .................. H01M 8/1018
521/27

FOREIGN PATENT DOCUMENTS

JP     A-2008-036491     2/2008

OTHER PUBLICATIONS

Hinsberg et al., Proceedings of SPIE, vol. 7637, 76370G-1 to 76370G-11, 2010.

* cited by examiner

*Primary Examiner* — Robert Harlan
(74) *Attorney, Agent, or Firm* — Knobbe Martens Olson & Bear LLP

(57) ABSTRACT

A resin composition for forming a phase-separated structure, including: a block copolymer, and an ion liquid containing a compound (IL) having a cation moiety and an anion moiety, the energy of the LUMO of the cation moiety being −4.5 eV or more, and the energy difference between the LUMO and the HOMO of the cation moiety being 10.0 ev or more, or the Log P value of the anion moiety being 1 to 3.

7 Claims, 1 Drawing Sheet

RESIN COMPOSITION FOR FORMING A PHASE-SEPARATED STRUCTURE, AND METHOD OF PRODUCING STRUCTURE CONTAINING PHASE-SEPARATED STRUCTURE

STATEMENT OF FEDERALLY SPONSORED RESEARCH OR DEVELOPMENT

This invention was made with government support under grant number 1344891 awarded by National Science Foundation. The government has certain rights in the invention.

TECHNICAL FIELD

The present invention relates to a resin composition for forming a phase-separated structure, and a method of producing a structure containing a phase-separated structure.

DESCRIPTION OF RELATED ART

Recently, as further miniaturization of large scale integrated circuits (LSI) proceeds, a technology for processing a more delicate structure is demanded.

In response to such demand, development has been conducted on a technology in which a fine pattern is formed using a phase-separated structure formed by self-assembly of a block copolymer having mutually incompatible blocks bonded together (see, for example, Patent Document 1).

For using a phase-separation structure of a block copolymer, it is necessary to form a self-organized nano structure by a microphase separation only in specific regions, and arrange the nano structure in a desired direction. For realizing position control and orientational control, processes such as graphoepitaxy to control phase-separated pattern by a guide pattern and chemical epitaxy to control phase-separated pattern by difference in the chemical state of the substrate are proposed (see, for example, Non-Patent Document 1).

A block copolymer forms a regular periodic structure by phase separation.

A "period of a structure" refers to a period of a phase structure observed when a phase-separated structure is formed, and is a sum of the lengths of the phases which are mutually incompatible. In the case of forming a cylinder structure which has a phase-separated structure perpendicular to a surface of a substrate, the period (L0) of the structure is the center distance (pitch) of two mutually adjacent cylinder structures.

It is known that the period (L0) of a block polymer is determined by intrinsic polymerization properties such as the polymerization degree N and the Flory-Huggins interaction parameter $\chi$. Specifically, the repulsive interaction between different block components of the block copolymer becomes larger as the product of $\chi$ and N, "$\chi \cdot N$" becomes larger. Therefore, when $\chi \cdot N > 10$ (hereafter, referred to as "strong segregation limit"), there is a strong tendency for the phase separation to occur between different blocks in the block copolymer. At the strong segregation limit, the period of the block copolymer is approximately $N^{2/3} \cdot \chi^{1/6}$, and a relationship represented by following formula (1) is satisfied. That is, the period of the structure is in proportion to the polymerization degree N which correlates with the molecular weight and molecular weight ratio between different blocks.

$$L0 \propto a \cdot N^{2/3} \cdot \chi^{1/6} \quad (1)$$

In the formula, L0 represents the period of the structure; a represents a parameter indicating the size of the monomer; N represents the polymerization degree; and $\chi$ indicates an interaction parameter. The larger the value of the interaction parameter, the higher the phase-separation performance.

Therefore, by adjusting the composition and the total molecular weight of the block copolymer, the period (L0) of the structure can be adjusted.

It is known that the periodic structure formed by a block copolymer changes to a cylinder, a lamellar or a sphere, depending on the volume ratio or the like of the polymer components. Further, it is known that the period depends on the molecular weight.

Therefore, in order to form a structure having a relatively large period (L0) using a phase-separated structure formed by self-assembly of a block copolymer, it is considered that such structure may be formed by increasing the molecular weight of the block copolymer.

DOCUMENTS OF RELATED ART

Patent Literature

[Patent Document 1] Japanese Unexamined Patent Application, First Publication No. 2008-36491

Non-Patent Documents

[Non-Patent Document 1] Proceedings of SPIE (U.S.), vol. 7637, pp. 76370G-1 (2010)

SUMMARY OF THE INVENTION

However, currently, in the case of forming a structure using a phase-separated structure formed by directed self-assembly of a widely used block copolymer (e.g., a block copolymer having a styrene block and a methyl methacrylate block), is was difficult to further improve the phase-separation performance.

The present invention takes the above circumstances into consideration, with an object of providing a resin composition for forming a phase-separated structure with improved phase-separation performance.

For solving the above-mentioned problems, the present invention employs the following aspects.

A first aspect of the present invention is a resin composition for forming a phase-separated structure, including: a block copolymer, and an ion liquid containing a compound (IL) having a cation moiety and an anion moiety, the energy of the LUMO of the cation moiety being −4.5 eV or more, and the energy difference between the LUMO and the HOMO of the cation moiety being 10.0 ev or more, or the Log P value of the anion moiety being 1 to 3.

A second aspect of the present invention is a method of producing a structure containing a phase-separated structure, including: using the resin composition for forming a phase-separated structure according to the first aspect to form a layer containing a block copolymer, and phase-separating the layer containing the block copolymer.

According to the present invention, there is provided a resin composition for forming a phase-separated structure with improved phase-separation performance.

DETAILED DESCRIPTION OF THE INVENTION

Figure 1:
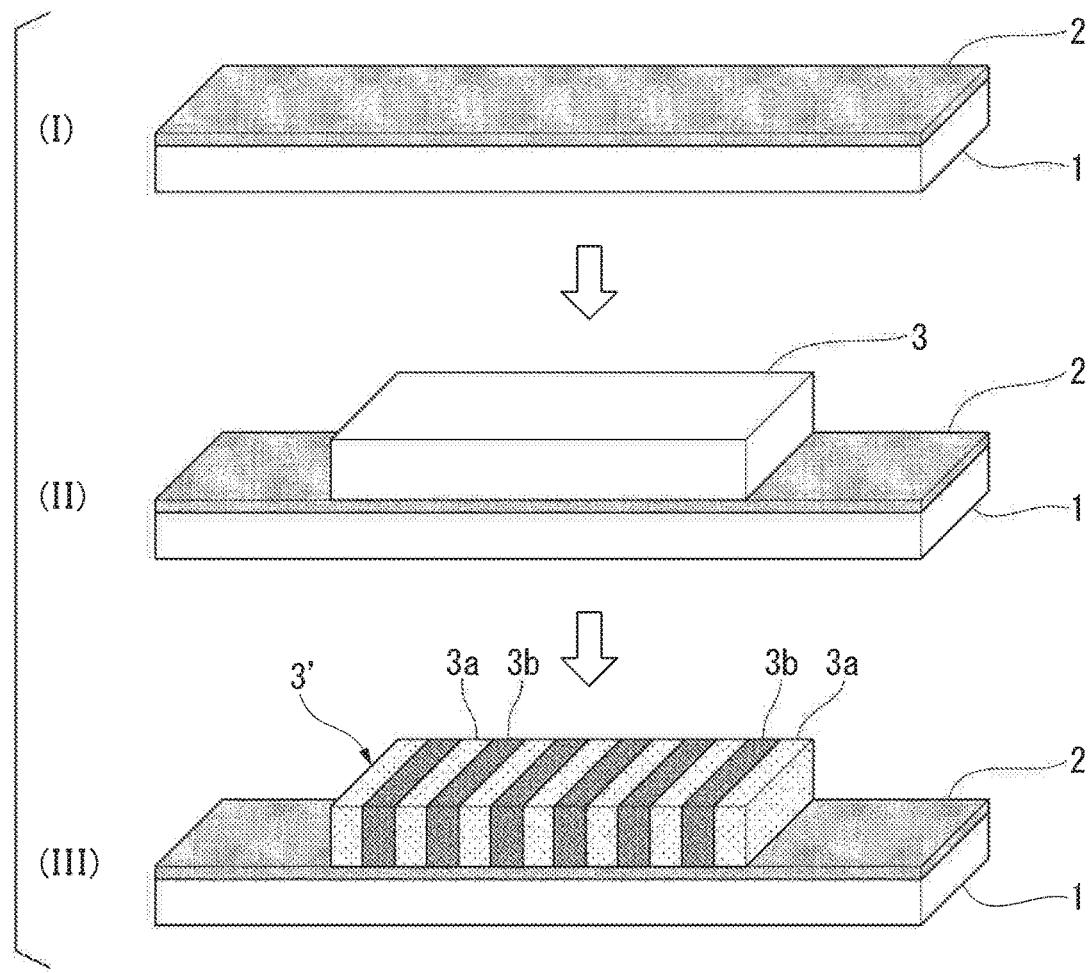
FIG. 1 is a schematic diagram showing an example of one embodiment of the method of forming a structure containing a phase-separated structure according to a second aspect of the present invention.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

The expression "may have a substituent" means that a case where a hydrogen atom (—H) is substituted with a monovalent group, or a case where a methylene (—$CH_2$—) group is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent ($R^{\alpha 0}$) in which the substituent has been substituted with a substituent containing an ester bond (e.g., an itaconic acid diester), or an acrylic acid having the hydrogen atom bonded to the carbon atom on the α-position substituted with a substituent ($R^{\alpha 0}$) in which the substituent has been substituted with a hydroxyalkyl group or a group in which the hydroxy group within a hydroxyalkyl group has been modified (e.g., α-hydroxyalkyl acrylate ester) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene" refers to a structural unit that is formed by the cleavage of the ethylenic double bond of hydroxystyrene. A "structural unit derived from a hydroxystyrene derivative" refers to a structural unit that is formed by the cleavage of the ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

The term "styrene" is a concept including styrene and compounds in which the hydrogen atom at the α-position of styrene is substituted with other substituent such as an alkyl group and a halogenated alkyl group.

The term "styrene derivative" includes compounds in which the hydrogen atom at the α-position of styrene has been substituted with another substituent such as an alkyl group or a halogenated alkyl group; and derivatives thereof. Examples of the derivatives thereof include hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

(Resin Composition for Forming Phase-Separated Structure)

The resin composition for forming a phase-separated structure according to a first aspect of the present invention (hereafter, referred to simply as "resin composition") includes a block copolymer, and an ion liquid containing a compound (IL) having a cation moiety and an anion moiety.

As one embodiment of the resin composition, for example, a block copolymer and the ion liquid may be dissolved in an organic solvent component.

<Block Copolymer>

A block copolymer is a polymeric material in which plurality of blocks (partial constitutional components in which the same kind of structural unit is repeatedly bonded) are bonded. As the blocks constituting the block copolymer, 2 kinds of blocks may be used, or 3 or more kinds of blocks may be used.

The plurality of blocks constituting the block copolymer are not particularly limited, as long as they are combinations capable of causing phase separation. However, it is preferable to use a combination of blocks which are mutually incompatible. Further, it is preferable to use a combination in which a phase of at least one block amongst the plurality of blocks constituting the block copolymer can be easily subjected to selective removal as compared to the phases of other blocks.

Further, it is preferable to use a combination in which a phase of at least one block amongst the plurality of blocks constituting the block copolymer can be easily subjected to selective removal as compared to the phases of other blocks. An example of a combination which can be selectively removed reliably include a block copolymer in which one or more blocks having an etching selectivity of more than 1 are bonded.

Examples of the block copolymer include a block copolymer in which a block of a structural unit having an aromatic group is bonded to a block of a structural unit derived from an (α-substituted) acrylate ester; a block copolymer in which a block of a structural unit having an aromatic group is bonded to a block of a structural unit derived from an (α-substituted) acrylic acid; a block copolymer in which a block of a structural unit having an aromatic group is bonded to a block of a structural unit derived from siloxane or a derivative thereof; a block copolymer in which a block of a structural unit derived from an alkyleneoxide is bonded to a block of a structural unit derived from an (α-substituted) acrylate ester; a block copolymer in which a block of a structural unit derived from an alkyleneoxide is bonded to a block of a structural unit derived from an (α-substituted) acrylic acid; a block copolymer in which a block of a structural unit containing a polyhedral oligomeric silsesquioxane structure is bonded to a block of a structural unit derived from an (α-substituted) acrylate ester; a block copolymer in which a block of a structural unit containing a silsesquioxane structure is bonded to a block of a structural unit derived from an (α-substituted) acrylic acid; and a block copolymer in which a block of a structural unit containing a silsesquioxane structure is bonded to a block of a structural unit derived from siloxane or a derivative thereof.

Examples of the structural unit having an aromatic group include structural units having a phenyl group, a naphthyl group or the like. Among these examples, a structural unit derived from styrene or a derivative thereof is preferable.

Examples of the styrene or derivative thereof include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, 4-vinylbenzylchloride, 1-vinylnaphthalene, 4-vinylbiphenyl, 1-vinyl-2-pyrolidone, 9-vinylanthracene, and vinylpyridine.

An (α-substituted) acrylic acid refers to either or both acrylic acid and a compound in which the hydrogen atom bonded to the carbon atom on the α-position of acrylic acid has been substituted with a substituent. As an example of such a substituent, an alkyl group of 1 to 5 carbon atoms can be given.

Examples of (α-substituted) acrylic acid include acrylic acid and methacrylic acid.

An (α-substituted) acrylate ester refers to either or both acrylate ester and a compound in which the hydrogen atom bonded to the carbon atom on the α-position of acrylate ester has been substituted with a substituent. As an example of such a substituent, an alkyl group of 1 to 5 carbon atoms can be given.

Specific examples of the (α-substituted) acrylate ester include acrylate esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate; and methacrylate esters such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate, and propyltrimethoxysilane methacrylate.

Among these, methyl acrylate, ethyl acrylate, t-butyl acrylate, methyl methacrylate, ethyl methacrylate, and t-butyl methacrylate are preferable.

Examples of siloxane and siloxane derivatives include dimethylsiloxane, diethylsiloxane, diphenylsiloxane, and methylphenylsiloxane.

Examples of the alkylene oxide include ethylene oxide, propylene oxide, isopropylene oxide and butylene oxide.

As the silsesquioxane structure-containing structural unit, polyhedral oligomeric silsesquioxane structure-containing structural unit is preferable. As a monomer which provides a polyhedral oligomeric silsesquioxane structure-containing structural unit, a compound having a polyhedral oligomeric silsesquioxane structure and a polymerizable group can be mentioned.

Among the above examples, as the block copolymer, a block copolymer containing a block of a structural unit having an aromatic group and a block of a structural unit derived from an (α-substituted) acrylic acid or an (α-substituted) acrylate ester is preferable.

In the case of obtaining a cylinder phase-separated structure oriented in a direction perpendicular to the surface of the substrate, the weight ratio of the structural unit having an aromatic group to the structural unit derived from an (α-substituted) acrylic acid or (α-substituted) acrylate ester is preferably in the range of 60:40 to 90:10, and more preferably 60:40 to 80:20.

In the case of obtaining a lamellar phase-separated structure oriented in a direction perpendicular to the surface of the substrate, the weight ratio of the structural unit having an aromatic group to the structural unit derived from an (α-substituted) acrylic acid or (α-substituted) acrylate ester is preferably in the range of 35:65 to 60:40, and more preferably 40:60 to 60:40.

Specific examples of such block copolymers include a block copolymer having a block of a structural unit derived from styrene and a block of a structural unit derived from acrylic acid; a block copolymer having a block of a structural unit derived from styrene and a block of a structural unit derived from methyl acrylate; a block copolymer having a block of a structural unit derived from styrene and a block of a structural unit derived from ethyl acrylate; a block copolymer having a block of a structural unit derived from styrene and a block of a structural unit derived from t-butyl acrylate; a block copolymer having a block of a structural unit derived from styrene and a block of a structural unit derived from methacrylic acid; a block copolymer having a block of a structural unit derived from styrene and a block of a structural unit derived from methyl methacrylate; a block copolymer having a block of a structural unit derived from styrene and a block of a structural unit derived from ethyl methacrylate; a block copolymer having a block of a structural unit derived from styrene and a block of a structural unit derived from t-butyl methacrylate; a block copolymer having a block of a structural unit containing a polyhedral oligomeric silsesquioxane (POSS) structure and a block of a structural unit derived from acrylic acid; and a block copolymer having a block of a structural unit containing a polyhedral oligomeric silsesquioxane (POSS) structure and a block of a structural unit derived from methyl acrylate.

In the present embodiment, the use of a block copolymer having a block of a structural unit derived from styrene (PS) and a block of a structural unit derived from methyl methacrylate (PMMA) is particularly preferable.

The number average molecular weight (Mn) (the polystyrene equivalent value determined by gel permeation chromatography (GPC)) of the block copolymer is preferably 6,000 or more, more preferably 8,000 to 200,000, and still more preferably 10,000~160,000.

The dispersity (Mw/Mn) of the block copolymer is preferably 1.0 to 3.0, more preferably 1.0 to 1.5, and still more preferably 1.0 to 1.3. Here, Mw is the weight average molecular weight.

In the present embodiment, in the resin composition, 1 kind of block copolymer may be used, or 2 or more kinds of block copolymers may be used in combination.

In the present embodiment, the amount of the block copolymer in the resin composition may be adjusted depending on the thickness of the layer containing the block copolymer to be formed.

<Ion Liquid>

In the present embodiment, the resin composition includes a compound (IL) having a cation moiety and a specific anion moiety.

An ion liquid refers to a salt which is present in the form of a liquid. An ion liquid is constituted of a cation moiety and an anion moiety. The electrostatic interaction between the cation moiety and the anion moiety is week, and the salt is unlikely to be crystallized. The ion liquid has a boiling point of 100° C. or lower, and has the following characteristics 1) to 5).

Characteristic 1) The vapor pressure is extremely low.
Characteristic 2) Non-flammable over a wide temperature range. Characteristic 3) Maintains a liquid state over a wide temperature range Characteristic 4) The density can be largely changed. Characteristic 5) The polarity can be controlled.

As ion liquid, an ion liquid in a liquid state at room temperature, and an ion liquid is a solid state at room temperature may be mentioned.

<<Compound (IL)>>

The compound (IL) is a compound having a cation moiety and an anion moiety, and the energy of the LUMO of the cation moiety is −4.5 eV or more, and the energy difference between the LUMO and the HOMO of the cation moiety is 10.0 ev or more, or the Log P value of the anion moiety is 1 to 3. Hereafter, a compound (IL) in which the energy of the LUMO of the cation moiety is −4.5 eV or more, and the energy difference between the LUMO and the HOMO of the cation moiety is 10.0 ev or more is referred to as "compound (IL-ca)". On the other hand, a compound (IL) in which the Log P value of the anion moiety is 1 to 3 is referred to as "compound (IL-an)".

[Compound (IL-ca)]

Cation Moiety of Compound (IL-ca)

In the cation moiety of the compound (IL-ca), the energy of the LUMO is −4.5 eV or more, and the energy difference between the LUMO and the HOMO is 10.0 ev or more, preferably the energy of the LUMO is −4.5 eV or more, and the energy difference between the LUMO and the HOMO is 10.5 ev or more, and more preferably the energy of the LUMO is −4.3 eV or more, and the energy difference between the LUMO and the HOMO is 10.5 ev or more.

In the compound (IL-ca), when energy of the LUMO of the cation moiety and the energy difference between the LUMO and the HOMO of the cation moiety are in the above-mentioned range, the compound (IL) is less likely to be decomposed by the annealing treatment in the phase separation. As a result, the change rate of the period (L0) of the resin composition (hereafter, referred to as "L0 change rate") may be reduced. In general, in order to improve the phase separation performance, it is known to raise the heating temperature or prolong the heating time in the annealing treatment during phase separation. When the L0 change rate of the resin composition is small, the annealing margin becomes large, and the phase separation performance is improved.

In the compound (IL), the energy of LUMO of the cation moiety and the energy difference between LUMO and HOMO of the cation moiety refer to simulation values by CAChe. For example, the dipole moment of the cation moiety can be determined by optimization of the structure by CAChe Work System Pro Version 6.1.12.33, using MM geometry (MM2) and PM3 geometry.

Preferable examples of cations in which the energy of LUMO is −4.5 eV or more and the energy difference in LUMO and HOMO is 10.0 ev or more include a pyrrolidinium ion, a piperidinium ion and an ammonium ion.

That is, preferable examples of the compound (IL-ca) include a pyrrolidinium salt, a piperidinium salt and an ammonium salt.

Anion Moiety of Compound (IL-ca)

The anion moiety of the compound (IL-ca) is not particularly limited, and examples thereof include anions represented by any one of general formulae (a1) to (a5) shown below.

[Chemical Formula 1]

 (a1)

 (a2)

 (a3)

In formula (a1), R represents an aromatic hydrocarbon group which may have a substituent, an aliphatic cyclic group which may have a substituent, or a chain hydrocarbon group which may have a substituent. In formula (a2), R' represents an alkyl group of 1 to 5 carbon atoms optionally substituted with a fluorine atom. k represents an integer of 1 to 4, and l represents an integer of 0 to 3, provided that k+l=4. in formula (a3), R" represents an alkyl group of 1 to 5 carbon atoms optionally substituted with a fluorine atom; m represents an integer of 1 to 6, and n represents an integer of 0 to 5, provided that m+n=6.

[Chemical Formula 2]

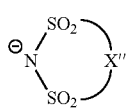 (a4)

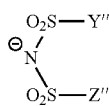 (a5)

In formula (a4), X" represents an alkylene group of 2 to 6 carbon atoms in which at least one hydrogen atom has been substituted with a fluorine atom; in formula (a5), Y" and Z" each independently represents an alkyl group of 1 to 10 carbon atoms in which at least one hydrogen atom has been substituted with a fluorine atom;

In general formula (a1), R represents an aromatic hydrocarbon group which may have a substituent, an aliphatic cyclic group which may have a substituent, or a chain hydrocarbon group which may have a substituent.

In general formula (a1), in the case where R is an aromatic hydrocarbon group which may have a substituent, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

As the aromatic hydrocarbon group for R, a phenyl group or a naphthyl group is preferable, and a phenyl group is more preferable.

In general formula (a1), in the case where R represents an aliphatic cyclic group which may have a substituent, the cyclic group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

Among these examples, as the aliphatic cyclic group, groups in which one or more hydrogen atoms have been removed from a polycycloalkane such as adamantane, norbornane, isobornane, tricyclodecane or tetracyclododecane are more preferable.

In general formula (a1), as the chain hydrocarbon group for R, a chain alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In general formula (a1), examples of the substituent for the aromatic hydrocarbon group, the aliphatic cyclic group or the chain hydrocarbon group for R include a hydroxy group, an alkyl group, a fluorine atom or a fluorinated alkyl group.

In general formula (a1), as R, a methyl group, a trifluoromethyl group or a p-tolyl group is preferable.

In general formula (a2), R' represents an alkyl group of 1 to 5 carbon atoms optionally substituted with a fluorine atom.

k represents an integer of 1 to 4, preferably an integer of 3 to 4, and most preferably 4.

l represents an integer of 0 to 3, preferably 0 to 2, most preferably 0. When l is 2 or more, the plurality of R' may be the same or different from each other, and are preferably the same.

In general formula (a3), R" represents an alkyl group of 1 to 5 carbon atoms optionally substituted with a fluorine atom;

m represents an integer of 1 to 6, preferably an integer of 3 to 6, and most preferably 6.

n represents an integer of 0 to 5, preferably 0 to 3, most preferably 0. When n is 2 or more, the plurality of R" may be the same or different from each other, and are preferably the same.

In formula (a4), X" represents an alkylene group of 2 to 6 carbon atoms in which at least one hydrogen atom has been substituted with a fluorine atom. The alkylene group may be linear or branched, and has 2 to 6 carbon atoms, preferably 3 to 5 carbon atoms, and most preferably 3 carbon atoms.

In formula (a5), Y" and Z" each independently represents an alkyl group of 1 to 10 carbon atoms in which at least one hydrogen atom has been substituted with a fluorine atom. The alkyl group may be linear or branched, and has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in an organic solvent component is improved.

In the alkylene group for X" and the alkyl group for Y" and Z", it is preferable that the number of hydrogen atoms substituted with fluorine atoms is as large as possible because the acid strength increases The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As the anion of the compound (IL-ca), an anion represented by any one of general formulae (a1), (a2) or (a3) is preferable. From the viewpoint of semiconductor production, an anion represented by general formula (a1) is more preferable.

As the compound (IL-ca), a pyrrolidinium salt or a piperidinium salt is preferable, a pyrrolidinium salt or a piperidinium salt in which the anion moiety has a Log P value of 1 to 3 is more preferable, and a pyrrolidinium salt or a piperidinium salt in which the anion moiety has a Log P value of 1 to 2.5 is still more preferable. The method of measuring the Log P value will be described later.

Specific examples of the compound (IL-ca) are shown below.

[Chemical Formula 3]

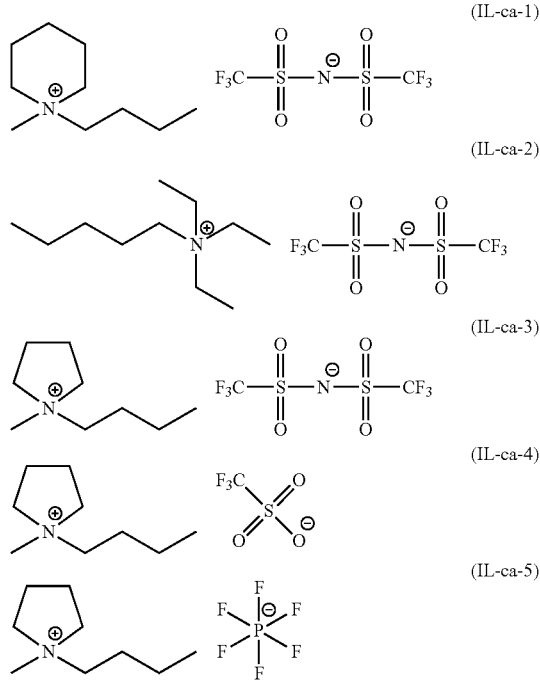

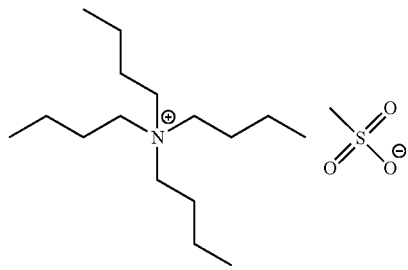

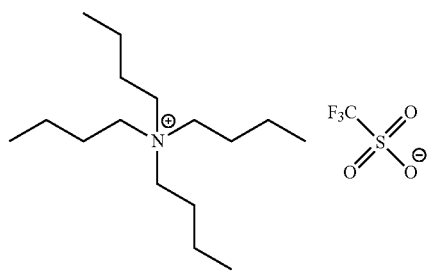

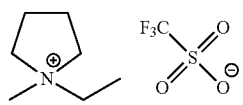

With respect to the above compounds (IL-ca-1) to (IL-ca-8), the energy (eV) of LUMO of the cation moiety, the energy difference (eV) between LUMO and HOMO of the cation moiety, and the Log P value of the anion moiety are shown in Table 1 below.

TABLE 1

| Compound (IL-ca) | LUMO of cation moiety (eV) | LUMO-HOMO of cation moiety (eV) | LogP value of anion moiety |
| --- | --- | --- | --- |
| (IL-ca-1) | −4.17 | 10.70 | 3.24 |
| (IL-ca-2) | −4.19 | 10.04 | 3.24 |
| (IL-ca-3) | −4.21 | 10.68 | 3.24 |
| (IL-ca-4) | −4.21 | 10.68 | 1.12 |
| (IL-ca-5) | −4.21 | 10.68 | 2.06 |
| (IL-ca-6) | −4.06 | 10.60 | −1.13 |
| (IL-ca-7) | −4.06 | 10.60 | 1.12 |
| (IL-ca-8) | −4.26 | 11.47 | 1.12 |

Among these examples, as the compound (IL-ca), compound (IL-ca-1) to compound (IL-ca-5) and compound (IL-ca-8) are preferable, compound (IL-ca-4), (IL-ca-5) or (IL-ca-8) is more preferable, and compound (IL-ca-4) is still more preferable.

[Compound (IL-an)]

Anion Moiety of Compound (IL-an)

The anion moiety of the compound (IL-an) has a Log P value of 1 to 3, preferably a Log P value of 1 to 2.5.

By virtue of the anion moiety of the compound (IL-an) having a Log P value within the above-mentioned range, the interaction between the compound (IL-an) and the block copolymer is improved, and the phase separation performance becomes good.

In the present embodiment, Log P value is a logarithmic value of n-octanol/water partition coefficient (P), and is an effective parameter for determining the hydrophilicity/hydrophobicity property of a wide variety of compounds. In general, the partition coefficient is determined not through experiments but by calculation. In the present embodiment, the partition coefficient is determined by optimization of the structure by CAChe Work System Pro Version 6.1.12.33, using MM geometry (MM2) and PM3 geometry.

The larger the Log P value becomes plus 0, it means that the hydrophobicity becomes higher. The larger the absolute value of the log P value becomes minus 0, it means that water solubility becomes higher. The log P value has a negative correlation with water solubility of an organic compound, and is widely used as a parameter for estimating the hydrophilicity/hydrophobicity of an organic compound.

Examples of anions having a Log P value of 1 to 3 include an anion represented by general formula (a1-an) shown below, general formula (a2) shown below or general formula (a3) shown below.

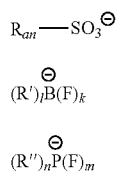

(a1-an)

$R_{an}-SO_3^{\ominus}$ (a2)

$(R')_l B(F)_k^{\ominus}$ (a3)

$(R'')_n P(F)_m^{\ominus}$

In formula (a1-an), $R_{an}$ represents a fluorinated alkyl group or an aromatic hydrocarbon group. In formula (a2), R' represents an alkyl group of 1 to 5 carbon atoms optionally substituted with a fluorine atom. k represents an integer of 1 to 4, and l represents an integer of 0 to 3, provided that k+l=4. in formula (a3), R" represents an alkyl group of 1 to 5 carbon atoms optionally substituted with a fluorine atom; m represents an integer of 1 to 6, and n represents an integer of 0 to 5, provided that m+n=6.

In general formula (a1-an), $R_{an}$ represents a fluorinated alkyl group or an aromatic hydrocarbon group, and is preferably a trifluoromethyl group or a p-tolyl group.

In general formula (a2), R', k and l are the same as defined above.

In general formula (a3), R", m and n are the same as defined above.

As the anion of the compound (IL-an), an anion represented by any one of general formulae (a1-an), (a2) or (a3) is preferable. From the viewpoint of semiconductor production, an anion represented by general formula (a1-an) is more preferable.

[Compound (IL-an)]

Cation Moiety of Compound (IL-an)

The cation moiety of the compound (IL-an) is not particularly limited, and examples thereof include an imidazolium ion, a pyrrolidinium ion, a piperidinium ion and an ammonium ion. Among these salts, in terms of improving the phase-separation performance, the cation moiety preferably has a substituent. Among these, a cation containing an alkyl group optionally having a substituent, or a cation containing a polar group is preferable. The alkyl group contained in the cation preferably has 1 to 12 carbon atoms, more preferably 2 to 6 carbon atoms. Examples of the substituent for the alkyl group include a hydroxy group, a vinyl group and an allyl group. Examples of the polar group contained in the cation include a carboxy group, a hydroxy group, an amino group and a sulfo group.

As the compound (IL-an), an imidazolium salt in which the anion moiety has a Log P value of 1 to 3 is preferable.

Specific examples of the compound (IL-an) are shown below.

[Chemical Formula 4]

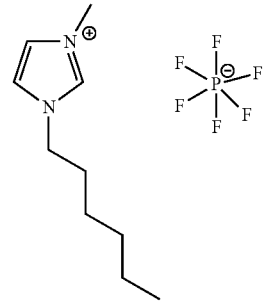

(IL-an-1)

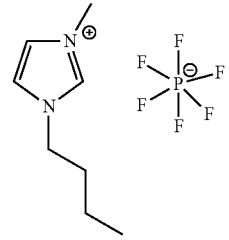

(IL-an-2)

[Chemical Formula 5]

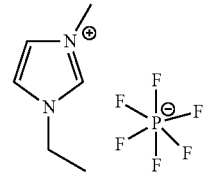

(IL-an-3)

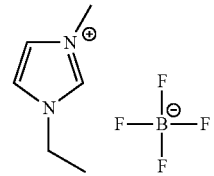

(IL-an-4)

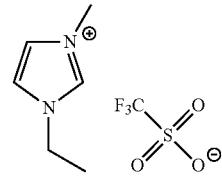

(IL-an-5)

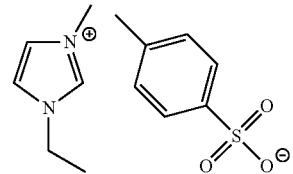

(IL-an-6)

With respect to the compounds (IL-an-1) to (IL-an-6), the Log P value of the anion moiety is shown in Table 2 below.

TABLE 2

| Compound (IL-an) | LogP value of anion moiety |
|---|---|
| (IL-an-1) | 2.06 |
| (IL-an-2) | 2.06 |
| (IL-an-3) | 2.06 |
| (IL-an-4) | 1.37 |
| (IL-an-5) | 1.12 |
| (IL-an-6) | 1.02 |

In the present embodiment, as the compound (IL), 1 kind of compound may be used, or 2 or more kinds of compounds may be used in combination.

In the present embodiment, the amount of the compound (IL) within the resin composition relative to 100 parts by weight of the block copolymer is preferably 0.05 to 50 parts by weight, more preferably 0.1 to 40 parts by weight, and still more preferably 0.5 to 30 parts by weight.

When the amount of the compound (IL) is within the above preferable range, the phase-separation performance may be further improved.

In the resin composition of the present embodiment, the ion liquid may contain a compound other than the compound (IL) which has a cation moiety and an anion moiety.

In the ion liquid the amount of the compound (IL) based on the total weight of the ion liquid is preferably 50% by weight or more, more preferably 70% by weight or more, still more preferably 90% by weight or more, and may be even 100% by weight. When the amount of the compound (IL) within the ion liquid is at least as large as the lower limit of the above preferable range, the phase-separation performance may be further improved.

<Organic Solvent Component>

In the present embodiment, the resin composition may be prepared by dissolving the aforementioned block copolymer and the aforementioned ion liquid in an organic solvent component.

The organic solvent component may be any organic solvent which can dissolve the respective components to give a uniform solution, and one or more kinds of any organic solvent can be appropriately selected from those which have been conventionally known as solvents for a film composition containing a resin as a main component.

Examples of the organic solvent component include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

As the organic solvent component, 1 kind of solvent may be used, or 2 or more kinds of solvents may be used in combination.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the organic solvent component for the resin composition for forming a phase-separated structure, a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the organic solvent component in the resin composition for forming a phase-separated structure is not particularly limited, and is adjusted appropriately to a concentration that enables application of a coating solution depending on the thickness of the coating film. In general, the organic solvent component is used in an amount that yields a solid content within a range from 0.2 to 70% by weight, and preferably from 0.2 to 50% by weight.

<Optional Components>

If desired, in addition to the block copolymer, the ion liquid and the organic solvent component, other miscible additives can also be added to the resin composition for forming a phase-separated structure. Examples of such miscible additives include additive resins for improving the performance of the layer of the brush layer, surfactants for improving the applicability, dissolution inhibitors, plasticizers, stabilizers, colorants, halation prevention agents, dyes, sensitizers, base amplifiers and basic compounds.

The resin composition for forming a phase-separated structure according to the present embodiment as described above contains, in addition to a block copolymer, a compound (IL) having a cation moiety and an anion moiety, and the energy of the LUMO of the cation moiety is −4.5 eV or more, and the energy difference between the LUMO and the HOMO of the cation moiety is 10.0 ev or more, or the Log P value of the anion moiety is 1 to 3. Therefore, the phase separation performance is improved.

As described above, In the compound (IL), when energy of the LUMO of the cation moiety and the energy difference between the LUMO and the HOMO of the cation moiety are in the above-mentioned range, the compound (IL) is less likely to be decomposed by the annealing treatment in the phase separation. As a result, the L0 change rate can be reduced. In general, in order to improve the phase separation performance, it is known to raise the heating temperature or prolong the heating time in the annealing treatment during phase separation. When the L0 change rate of the resin composition is small, the annealing margin becomes large, and the phase separation performance is improved.

Further, as described above, by virtue of the anion moiety of the compound (IL) having a Log P value within the above-mentioned range, the interaction between the compound (IL) and the block copolymer is improved, and the phase separation performance becomes good.

A structure formed by using a resin composition containing the compound (IL) has reduced roughness and is unlikely to have defects generated.

Further, by using a block copolymer having a low polymerization degree in combination with the compound (IL), a structure having a smaller (L0), i.e., a pattern of a finer structure can be formed.

Thus, by using a resin composition for forming a phase-separated structure according to the present embodiment, the phase-separation performance can be further improved.

(Method of Producing Structure Containing Phase-Separated Structure)

A method of producing a structure containing a phase-separated structure according to a second aspect of the present invention includes: using the resin composition for forming a phase-separated structure according to the first aspect to form a layer containing a block copolymer (hereafter, referred to as "step (i)"), and phase-separating the layer containing the block copolymer (hereafter, referred to as "step (ii)").

Hereinafter, the method of producing a structure containing a phase-separated structure will be specifically described with reference to FIG. 1. However, the present invention is not limited to these embodiments.

FIG. 1 shows an example of one embodiment of the method of forming a structure containing a phase-separated structure.

Firstly, a brush composition is applied to a substrate 1, so as to form a brush layer 2 (FIG. 1 (I)).

Then, to the brush layer 2, the resin composition for forming a phase-separated structure according to the first aspect (resin composition) is applied, so as to form a layer 3 containing a block copolymer (BCP layer 3) (FIG. 1(II); step (i)).

Next, heating is conducted to perform an annealing treatment, so as to phase-separate the BCP layer 3 into a phase 3a and a phase 3b (FIG. 1 (III); step (ii)).

According to the production method of the present embodiment, that is, the production method including the steps (i) and (ii), a structure 3' containing a phase-separated structure is formed on the substrate 1 having the brush layer 2 formed thereon.

[Step (i)]

In step (i), the resin composition for forming a phase-separated structure is applied to the substrate 1, so as to form a BCP layer 3.

There are no particular limitations on the type of a substrate, provided that the resin composition for forming a phase-separated structure can be coated on the surface of the substrate.

Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

The size and the shape of the substrate is not particularly limited. The substrate does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

On the surface of the substrate, an inorganic and/or organic film may be provided. As the inorganic film, an inorganic antireflection film (inorganic BARC) can be used. As the organic film, an organic antireflection film (organic BARC) can be used.

Before forming a BCP layer 3 on the substrate 1, the surface of the substrate 1 may be cleaned. By cleaning the surface of the substrate, application of the resin composition for forming a phase-separated structure or the brush composition to the substrate 1 may be satisfactorily performed.

As the cleaning treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a BCP layer 3 or a brush layer 2 is formed on the surface of the substrate.

Before forming a BCP layer 3 on the substrate 1, the surface of the substrate 1 may be cleaned.

A neutralization treatment is a treatment in which the surface of the substrate is modified so as to have affinity for all polymers constituting the block copolymer. By the neutralization treatment, it becomes possible to prevent only phases of specific polymers to come into contact with the surface of the substrate by phase separation. For example, prior to forming a BCP layer 3, on the surface of the substrate 1, it is preferable to form a brush layer 2 depending on the kind of block copolymer to be used. As a result, by phase-separation of the BCP layer 3, a cylinder structure or lamellar structure oriented in a direction perpendicular to the surface of the substrate 1 can be reliably formed.

Specifically, on the surface of the substrate 1, a brush layer 2 is formed using a brush composition having affinity for all polymers constituting the block copolymer.

The brush composition can be appropriately selected from conventional resin compositions used for forming a thin film, depending on the kind of polymers constituting the block copolymer.

Examples of the brush composition include a composition containing a resin which has all structural units of the polymers constituting the block copolymer, and a composition containing a resin which has all structural units having high affinity for the polymers constituting the block copolymer.

For example, when a PS-PMMA block copolymer is used, as the brush composition, it is preferable to use a resin composition containing both PS and PMMA as blocks, or a compound or a composition containing both a portion having a high affinity for an aromatic ring and a portion having a high affinity for a functional group with high polarity.

Examples of the resin composition containing both PS and PMMA as blocks include a random copolymer of PS and PMMA, and an alternating polymer of PS and PMMA (a copolymer in which the respective monomers are alternately copolymerized).

Examples of the composition containing both a portion having a high affinity for PS and a portion having a high affinity for PMMA include a resin composition obtained by polymerizing at least a monomer having an aromatic ring and a monomer having a substituent with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a substituent with high polarity include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Examples of the compound containing both a portion having a high affinity for PS and a portion having a high affinity for PMMA include a compound having both an aryl group such as a phenethyltrichlorosilane and a substituent with high polarity, and a compound having both an alkyl group and a substituent with high polarity, such as an alkylsilane compound.

Further, as the brush composition, for example, a heat-polymerizable resin composition, or a photosensitive resin composition such as a positive resist composition or a negative resist composition can also be mentioned.

The brush layer may be formed by a conventional method.

The method of applying the brush composition to the substrate 1 to form a brush layer 2 is not particularly limited, and the brush layer 2 can be formed by a conventional method.

For example, the brush composition can be applied to the substrate 1 by a conventional method using a spinner or the like to form a coating film on the substrate 1, followed by drying, thereby forming a brush layer 2.

The drying method of the coating film is not particularly limited, provided it can volatilize the solvent contained in the brush composition, and a baking method and the like are exemplified. The baking temperature is preferably 80° C. to 300° C., more preferably 180° C. to 270° C., and still more preferably 220° C. to 250° C. The baking time is preferably 30 seconds to 500 seconds, and more preferably 60 seconds to 400 seconds.

The thickness of the brush layer 2 after drying of the coating film is preferably about 10 to 100 nm, and more preferably about 40 to 90 nm.

Subsequently, on the brush layer 2, a layer 3 containing a block copolymer having a plurality of blocks bonded (BCP layer 3) is formed.

The method of forming the BCP layer 3 on the brush layer 2 is not particularly limited, and examples thereof include a method in which the resin composition is applied to the brush layer 2 by a conventional method using spincoating or a spinner, followed by drying.

The drying method of the coating film of the resin composition is not particularly limited, provided it can volatilize the organic solvent component included in the resin composition, and a baking method or the like can be mentioned. At this time, prior to the phase-separation operation in step (ii), it is preferable to conduct the baking or the like in a manner such that the ion liquid remains in the coating film as much as possible. Therefore, the baking is temperature is, for example, preferably from 60 to 350° C., and more preferably from 80 to 280° C. The baking time is, for example, preferably from 10 to 3,000 seconds, and more preferably from 20 to 120 seconds.

The BCP layer 3 may have a thickness satisfactory for phase-separation to occur. In consideration of the kind of the substrate 1, the structure period size of the phase-separated structure to be formed, and the uniformity of the nanostructure, the thickness is preferably 20 to 100 nm, and more preferably 30 to 80 nm.

For example, in the case where the substrate 1 is an Si substrate or an $SiO_2$, the thickness of the BCP layer 3 is preferably 20 to 100 nm, and more preferably 30 to 80 nm.

In the case where the substrate 1 is a Cu substrate, the thickness of the BCP layer 3 is preferably 10 to 100 nm, and more preferably 30 to 80 nm.

[Step (ii)]

Step (ii), the layer 3 containing a block copolymer formed on the substrate 1 is phase-separated.

By heating the substrate 1 after step (i) to conduct the anneal treatment, the block copolymer is selectively removed, such that a phase-separated structure in which at least part of the surface of the substrate 1 is exposed is formed. That is, on the substrate 1, a structure 3' containing a phase-separated structure in which phase 3a and phase 3b are phase separated is produced.

The anneal treatment is preferably conducted at a temperature at least as high as the glass transition temperature of the block copolymer used and lower than the heat decomposition temperature. For example, in the case where the block copolymer is a polystyrene-polymethacrylate (PS-PMMA) block copolymer, (number average molecular weight: 6000 to 200,000), the heat treatment is preferably conducted at 100 to 400° C., more preferably 120 to 350° C., and most preferably 150 to 300° C. The heating time is preferably 30 to 3,600 seconds, and more preferably 120 to 600 seconds.

Further, the anneal treatment is preferably conducted in a low reactive gas such as nitrogen.

By the method of producing a structure containing a phase-separated structure according to the present embodiment described heretofore, the phase-separation performance of the block copolymer can be enhanced, and a fine structure with a good shape can be formed, as compared to conventional lithography techniques.

In addition, on the surface of the substrate, a substrate provided with a nanostructure which has the position and the orientation designed more freely can be produced. For example, the formed structure has high adhesion to the substrate, and is likely to have a phase-separated structure with a cylinder structure or lamellar structure oriented in a direction perpendicular to the surface of the substrate.

[Optional Step]

The method of forming a structure containing a phase-separated structure according to the second aspect of the present invention is not limited to the above embodiment, and may include a step (optional step) other than steps (i) and (ii).

Examples of the optional steps include a step of selectively removing a phase constituted of at least one block of the plurality of blocks constituting the block copolymer contained in the BCP layer 3 (hereafter, referred to as "step (iii)"), and a guide pattern formation step.

Step (iii)

In step (iii), from the BCP layer 3 formed on the brush layer 2, a phase constituted of at least one block of the plurality of blocks constituting the block copolymer (phase 3a and phase 3b) is selectively removed. In this manner, a fine pattern (polymeric nanostructure) can be formed.

Examples of the method of selectively removing a phase constituted of a block include a method in which an oxygen plasma treatment or a hydrogen plasma treatment is conducted on the BCP layer.

Hereafter, among the blocks constituting the block copolymer, a block which is not selectively removed is referred to as "block $P_A$", and a block to be selectively removed is referred to as "block $P_B$". For example, after the phase separation of a layer containing a PS-PMMA block copolymer, by subjecting the layer to an oxygen plasma treatment or a hydrogen plasma treatment, the phase of PMMA is selectively removed. In such a case, the PS portion is the block $P_A$, and the PMMA portion is the block $P_B$.

Figure 2:
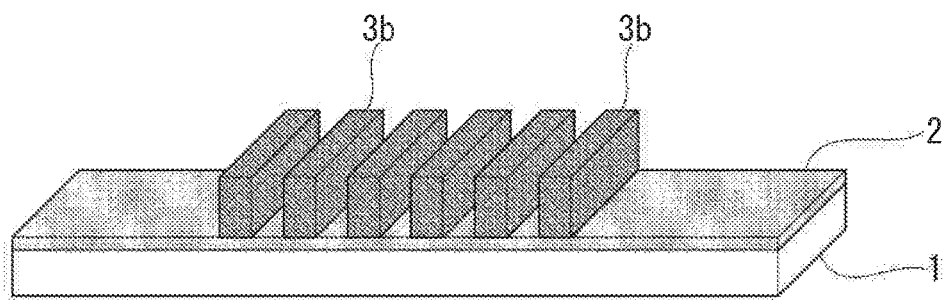
FIG. 2 is an explanatory diagram showing an example of one embodiment of an optional step.

FIG. 2 shows an example of one embodiment of step (iii).

In the embodiment shown in FIG. 2, by conducting oxygen plasma treatment on the structure 3' produced on the substrate 1 in step (ii), the phase 3a is selectively removed, and a pattern (polymeric nanostructure) constituted of phases 3b separated from each other is formed. In this case, the phase 3b is the phase constituted of the block $P_A$, and the phase 3a is the phase constituted of the block $P_B$.

The substrate 1 having a pattern formed by phase-separation of the BCP layer 3 as described above may be used as it is, or may be further heated to modify the shape of the pattern (polymeric nanostructure) on the substrate 1.

The heat treatment is preferably conducted at a temperature at least as high as the glass transition temperature of the block copolymer used and lower than the heat decomposition temperature. Further, the heating is preferably conducted in a low reactive gas such as nitrogen.

Guide Pattern Forming Step

In the method of forming a structure containing a phase-separated structure according to the second aspect of the present invention, a step of forming a guide pattern on the brush layer (guide pattern forming step) may be included. In this manner, it becomes possible to control the arrangement of the phase-separated structure.

For example, in the case of a block copolymer where a random fingerprint-patterned phase separation structure is formed without using a guide pattern, by providing a trench pattern of a resist film on the surface of the brush layer, a phase separation structure arranged along the trench can be obtained. The guide pattern can be provided on the brush layer 2 in accordance with the above-described principle. Further, when the surface of the guide pattern has affinity for any of the polymers constituting the block copolymer, a phase separation structure having a cylinder structure or lamellar structure arranged in the perpendicular direction of the surface of the substrate can be more reliably formed.

The guide pattern can be formed, for example, using a resist composition.

The resist composition for forming the guide pattern can be appropriately selected from resist compositions or a modified product thereof typically used for forming a resist pattern which have affinity for any of the polymers constituting the block copolymer. The resist composition may be either a positive resist composition capable of forming a positive pattern in which exposed portions of the resist film are dissolved and removed, or a negative resist pattern capable of forming a negative pattern in which unexposed portions of the resist film are dissolved and removed, but a negative resist composition is preferable. As the negative resist composition, for example, a resist composition containing an acid-generator component and a base component which exhibits decreased solubility in an organic solvent-containing developing solution under action of acid, wherein the base component contains a resin component having a structural unit which is decomposed by action of acid to exhibit increased polarity, is preferable.

When the resin composition is cast onto the brush layer having the guide pattern formed thereon, an anneal treatment is conducted to cause phase-separation. Therefore, the resist pattern for forming a guide pattern is preferably capable of forming a resist film which exhibits solvent resistance and heat resistance.

EXAMPLES

As follows is a description of examples of the present invention, although the scope of the present invention is by no way limited by these examples.

Examples 1 to 14, Comparative Examples 1 to 3

<Preparation of Resin Composition>

The components shown in Table 3 were mixed together and dissolved to obtain each resin composition (solid content: 0.7 wt %). Ion liquids were blended in equimolar amounts.

TABLE 3

| Resin composition | Block copolymer | Ion liquid | Organic solvent component |
|---|---|---|---|
| Example 1 | BCP-1 [100] | (IL-ca-1) [5.59] | (S)-1 [12400] |
| Example 2 | BCP-1 [100] | (IL-ca-2) [5.80] | (S)-1 [12400] |
| Example 3 | BCP-1 [100] | (IL-ca-3) [5.41] | (S)-1 [12400] |
| Example 4 | BCP-1 [100] | (IL-ca-4) [3.73] | (S)-1 [12400] |
| Example 5 | BCP-1 [100] | (IL-ca-5) [3.68] | (S)-1 [12400] |
| Example 6 | BCP-1 [100] | (IL-ca-6) [4.32] | (S)-1 [12400] |
| Example 7 | BCP-1 [100] | (IL-ca-7) [5.01] | (S)-1 [12400] |
| Example 8 | BCP-1 [100] | (IL-ca-8) [3.37] | (S)-1 [12400] |
| Comparative Example 1 | BCP-1 [100] | (IL-A) [5.73] | (S)-1 [12400] |
| Example 9 | BCP-1 [100] | (IL-an-1) [4.00] | (S)-1 [12400] |
| Example 10 | BCP-1 [100] | (IL-an-2) [3.64] | (S)-1 [12400] |
| Example 11 | BCP-1 [100] | (IL-an-3) [3.28] | (S)-1 [12400] |
| Example 12 | BCP-1 [100] | (IL-an-4) [2.54] | (S)-1 [12400] |
| Example 13 | BCP-1 [100] | (IL-an-5) [3.33] | (S)-1 [12400] |
| Example 14 | BCP-1 [100] | (IL-an-6) [3.62] | (S)-1 [12400] |
| Comparative Example 2 | BCP-1 [100] | (IL-B) [5.01] | (S)-1 [12400] |
| Comparative Example 3 | BCP-1 [100] | (IL-C) [2.64] | (S)-1 [12400] |

In Table 3, the reference characters indicate the following. The values in brackets [ ] indicate the amount (in terms of parts by weight) of the component added.

BCP-1: a block copolymer of polystyrene (PS block) and poly(methyl methacrylate) (PMMA block) [Mn: PS 23,000, PMMA 23,000, total 46000; PS/PMMA compositional ratio (weight ratio) 50.0/50.0; dispersity 1.02].

(S)-1: a mixed solvent of propylene glycol monomethyl ether acetate (PGMEA)/propylene glycol monomethyl ether (PGME)=6/4 (weight ratio)

(IL-ca-1) to (IL-ca-8): compounds represented by the following chemical formulae (IL-ca-1) to (IL-ca-8), respectively (IL-A): compound represented by the following chemical formula (IL-A)

(IL-an-1) to (IL-an-6): compounds represented by the following chemical formulae (IL-an-1) to (IL-an-6), respectively (IL-B): compound represented by the following chemical formula (IL-B)

(IL-C): compound represented by the following chemical formula (IL-C)

With respect to each ion liquid, the energy of LUMO of the cation moiety, the energy difference between LUMO and HOMO of the cation moiety, and the Log P value of the anion moiety are shown in Table 2. The energy of LUMO of the cation moiety, the energy difference between LUMO and HOMO of the cation moiety, and the Log P value are values determined by optimization of the structure by CAChe Work System Pro Version 6.1.12.33, using MM geometry (MM2) and PM3 geometry.
[Chemical Formula 6]
(IL-ca-1)
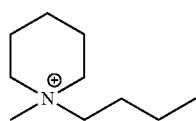 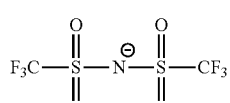
(IL-ca-2)
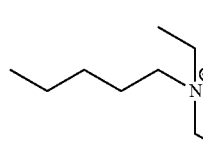 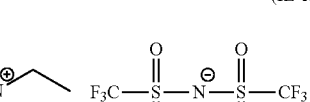
(IL-ca-3)
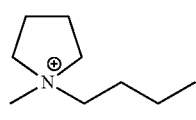 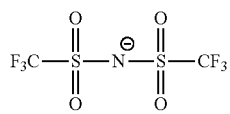
(IL-ca-4)
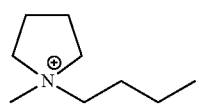 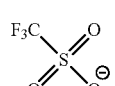
[Chemical Formula 7]
(IL-ca-5)
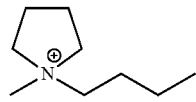 
(IL-ca-6)
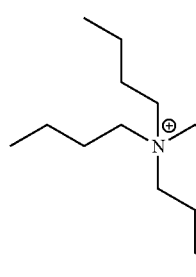 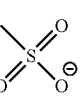
(IL-ca-7)
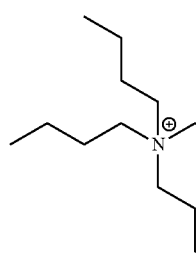 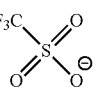
(IL-ca-8)
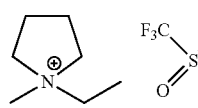 
[Chemical Formula 8]
(IL-A)
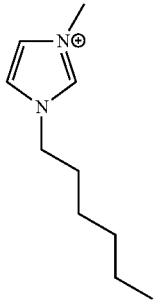 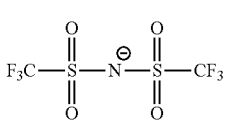
[Chemical Formula 9]
(IL-an-1)
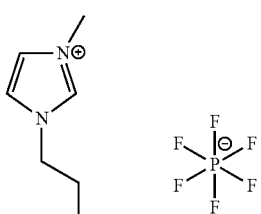
(IL-an-2)
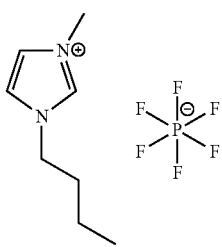
[Chemical Formula 10]
(IL-an-3)
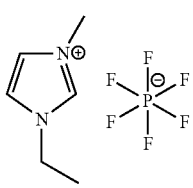
(IL-an-4)
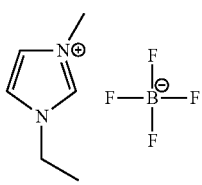
(IL-an-5)
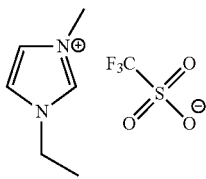

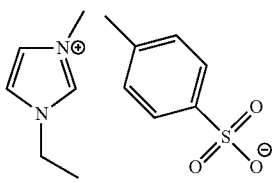
(IL-an-6)

[Chemical Formula 11]

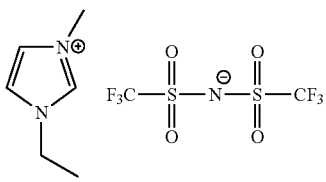
(IL-B)

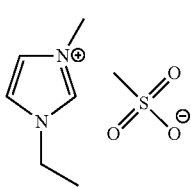
(IL-C)

<Evaluation of Film Retention Ratio>

Each resin composition shown in Table 3 was adjusted to a solid content of 0.7% by weight and applied to a wafer, and baking was conducted under the following conditions to form a coating film.

Condition a) Baking in air at 90° C. for 1 minute.
Condition b) Baking in air at 230° C. for 15 minutes.

The film thickness of the coating film formed under each condition was measured, and the film retention ratio was calculated by the following formula.

Film retention ratio (%)=[(Film thickness of coating film formed under condition b))/(Film thickness of coating film formed under condition a))]×100

The results are shown in Table 4.

(Production of Structure Containing Phase-Separated Structure)

[Step (i)]

The following brush composition was applied to a 300 mm silicon (Si) wafer by spin-coating (number of rotation: 1,500 rpm, 60 seconds), followed by drying by baking in air at 250° C. for 60 seconds, so as to form a brush layer having a film thickness of 100 nm.

As the brush composition, a PGMEA solution of a copolymer having a styrene (St) unit and a methyl methacrylate (MMA) unit (resin concentration: 3.3 wt %) was used.

Subsequently, the brush layer was rinsed with OK73 thinner (product name; manufactured by Tokyo Ohka Kogyo Co., Ltd.), so as to remove the uncrosslinked portions and the like of the random copolymer. Then, baking was conducted at 250° C. for 60 seconds. After the baking, the brush layer formed on the Si wafer had a film thickness of 2 nm.

Thereafter, each resin composition was spin-coated (number of rotation: 1,500 rpm, 60 seconds) to cover the brush layer formed on the wafer, so as to form a PS-PMMA block copolymer layer having a film thickness of 30 nm.

[Step (ii)]

Next, an anneal treatment was conducted under the following condition 1) or 2), so as to phase-separate the PS-PMMA block copolymer layer into a phase constituted of PS and a phase constituted of PMMA, thereby forming a phase-separated structure.

Condition 1) Heating at 200° C. for 60 seconds.
Condition 2) Heating at 200° C. for 30 minutes.

After steps (i) and (ii), a structure containing a phase-separated structure was formed on the brush layer in the case of using the resin compositions of each example.

[Step (iii)]

A wet etching treatment was conducted on the silicon (Si) wafer having the phase-separated structure formed thereon, so as to selectively remove the phase constituted of PMMA.

<Evaluation of Change Rate in Period>

In step (ii) in the aforementioned <Production of structure containing phase-separated structure>, the period (L0 1 min) of the phase-separated structure formed by annealing treatment under condition 1), and the period (L0 30 min) of the phase-separated structure formed by annealing treatment under condition 2) were determined. The period of the phase-separated structure was measured by a method using an image analysis software MATLAB.

From the following formula, the change rate in the period (L0 change rate) was determined.

$$L0 \text{ change rate (\%)} = \{|[(L0 \text{ 1 min}) - (L0 \text{ 30 min})|]/(L0 \text{ 1 min})\} \times 100$$

The results are shown in Table 4.

TABLE 4

| | Ion liquid | | | | | | |
|---|---|---|---|---|---|---|---|
| Compound | LUMO of cation moiety (eV) | LUMO - HOMO of cation moiety (eV) | LogP value of anion moiety | Film retention ratio (%) | L0 1 min (nm) | L0 30 min (nm) | L0 change rate (%) |
| Example 1 | −4.17 | 10.70 | 3.24 | 88.48 | 29.5 | 28.5 | 3.39 |
| Example 2 | −4.19 | 10.04 | 3.24 | 84.43 | 29.6 | 28.2 | 4.73 |
| Example 3 | −4.21 | 10.68 | 3.24 | 86.06 | 29.5 | 28.4 | 3.73 |
| Example 4 | −4.21 | 10.68 | 1.12 | 95.99 | 27.6 | 26.9 | 2.5 |
| Example 5 | −4.21 | 10.68 | 2.06 | 96.71 | 28.5 | 28.0 | 1.75 |
| Example 6 | −4.06 | 10.60 | −1.13 | — | 27.3 | 25.8 | 5.49 |
| Example 7 | −4.06 | 10.60 | 1.12 | 80.25 | 28.5 | 27.0 | 5.26 |
| Example 8 | −4.26 | 11.47 | 1.12 | 97.50 | 27.5 | 26.8 | 2.55 |
| Comparative Example 1 | −4.93 | 8.69 | 3.24 | 77.18 | 29.0 | 25.8 | 11.03 |
| Example 9 | −4.93 | 8.69 | 2.06 | 94.49 | 28.7 | 27.9 | 2.79 |
| Example 10 | −4.94 | 9.66 | 2.06 | — | 28.4 | 27.7 | 2.46 |
| Example 11 | −4.95 | 10.00 | 2.06 | 96.18 | 28.5 | 27.6 | 3.16 |
| Example 12 | −4.95 | 10.00 | 1.37 | — | 26.0 | 25.3 | 2.69 |

TABLE 4-continued

| | Ion liquid | | | | | | |
|---|---|---|---|---|---|---|---|
| Compound | LUMO of cation moiety (eV) | LUMO - HOMO of cation moiety (eV) | LogP value of anion moiety | Film retention ratio (%) | L0 1 min (nm) | L0 30 min (nm) | L0 change rate (%) |
| Example 13 | −4.95 | 10.00 | 1.12 | 87.88 | 27.3 | 25.9 | 4.95 |
| Example 14 | −4.95 | 10.00 | 1.02 | 92.95 | — | — | — |
| Comparative Example 2 | −4.95 | 10.00 | 3.24 | 84.52 | 29.1 | 25.9 | 11.00 |
| Comparative Example 3 | −4.95 | 10.00 | −1.13 | 73.37 | — | — | — |

From the results shown in Table 4, it was confirmed that the resin compositions of Examples 1 to 14 exhibited excellent phase-separation performance.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resin composition for forming a phase-separated structure, comprising:
    a block copolymer; and
    a non-polymeric ion liquid containing a compound (IL) having a cation moiety and an anion moiety,
    wherein the amount of the compound (IL) within the resin composition relative to 100 parts by weight of the block copolymer is 0.05 to 50 parts by weight, and
    wherein the LUMO of the cation moiety is −4.5 eV or more, and the difference between the LUMO and the HOMO of the cation moiety is 10.0 ev or more, and/or the Log P of the anion moiety is 1 to 3.

2. The resin composition for forming a phase-separated structure according to claim 1, wherein the LUMO of the cation moiety is −4.5 eV or more, and the difference between the LUMO and the HOMO of the cation moiety is 10.5 ev or more, or
    the Log P of the anion moiety is 1 to 3.

3. The resin composition for forming a phase-separated structure according to claim 1, wherein the compound (IL) is a pyrrolidinium salt, a piperidinium salt or an ammonium salt.

4. The resin composition for forming a phase-separated structure according to claim 1, wherein the compound (IL) is a pyrrolidinium salt or a piperidinium salt.

5. The resin composition for forming a phase-separated structure according to claim 4, wherein the Log P of the anion moiety is 1 to 3.

6. The resin composition for forming a phase-separated structure according to claim 1, wherein the compound (IL) is an imidazolium salt, and the Log P of the anion moiety is 1 to 3.

7. A method of producing a structure containing a phase-separated structure, comprising:
    using the resin composition for forming a phase-separated structure according to claim 1 to form a layer containing a block copolymer, and
    phase-separating the layer containing the block copolymer.

* * * * *